US012125822B2

(12) United States Patent
Yang et al.

(10) Patent No.: US 12,125,822 B2
(45) Date of Patent: Oct. 22, 2024

(54) METHOD OF MANUFACTURING A SEMICONDUCTOR DEVICE PACKAGE HAVING DUMMY DIES

(71) Applicant: Taiwan Semiconductor Manufacturing Company, Ltd., Hsinchu (TW)

(72) Inventors: Che-Chia Yang, Taipei (TW); Shu-Shen Yeh, Taoyuan (TW); Po-Chen Lai, Hsinchu County (TW); Ming-Chih Yew, Hsinchu (TW); Po-Yao Lin, Zhudong Township, Hsinchu County (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 38 days.

(21) Appl. No.: 17/097,059

(22) Filed: Nov. 13, 2020

(65) Prior Publication Data

US 2022/0157777 A1    May 19, 2022

(51) Int. Cl.
*H01L 25/065* (2023.01)
*H01L 23/00* (2006.01)
*H01L 23/31* (2006.01)
*H01L 25/00* (2006.01)

(52) U.S. Cl.
CPC ...... *H01L 25/0655* (2013.01); *H01L 23/3185* (2013.01); *H01L 23/562* (2013.01); *H01L 24/16* (2013.01); *H01L 25/50* (2013.01); *H01L 2224/16157* (2013.01)

(58) Field of Classification Search
None
See application file for complete search history.

(56) References Cited

U.S. PATENT DOCUMENTS 9,312,193 B2 *   4/2016   Chen .................. H01L 25/0655
10,304,784 B2 *  5/2019   Kim .................... H01L 21/6835
10,510,674 B2   12/2019   Lin et al.
(Continued)

FOREIGN PATENT DOCUMENTS

KR   101901711 B1 *  9/2018
TW   201818514 A      5/2018

OTHER PUBLICATIONS

Chinese language office action dated Dec. 9, 2021, issued in application No. TW 110130417.
(Continued)

*Primary Examiner* — Telly D Green
(74) *Attorney, Agent, or Firm* — McClure, Qualey & Rodack, LLP

(57) ABSTRACT

A semiconductor device package and a method of forming the same are provided. The semiconductor device package includes a substrate, a first package component, a second package component, and at least one dummy die. The first and second package components are disposed over and bonded to the substrate. The first and second package components are different types of electronic components that provide different functions. The dummy die is disposed over and attached to the substrate. The dummy die is located between the first and second package components and is electrically isolated from the substrate.

20 Claims, 15 Drawing Sheets

(56) References Cited

U.S. PATENT DOCUMENTS

| | | | | |
|---|---|---|---|---|
| 10,861,799 B1* | 12/2020 | Wu | ............... | H01L 23/3128 |
| 10,867,965 B2 | 12/2020 | Shih et al. | | |
| 11,315,886 B2* | 4/2022 | Choi | ............... | H01L 23/16 |
| 11,728,278 B2* | 8/2023 | Lu | ............... | H01L 23/49816 |
| | | | | 257/668 |
| 2009/0289339 A1* | 11/2009 | Hu | ............... | H01L 23/3128 |
| | | | | 257/E23.116 |
| 2016/0190073 A1* | 6/2016 | Chen | ............... | H01L 23/16 |
| | | | | 257/723 |
| 2016/0322330 A1* | 11/2016 | Lin | ............... | H01L 25/0652 |
| 2016/0358865 A1* | 12/2016 | Shih | ............... | H01L 24/97 |
| 2018/0138101 A1* | 5/2018 | Yu | ............... | H01L 21/486 |
| 2018/0138151 A1* | 5/2018 | Shih | ............... | H01L 25/50 |
| 2018/0175011 A1 | 6/2018 | Sung et al. | | |
| 2019/0096825 A1* | 3/2019 | Kim | ............... | H01L 21/56 |
| 2019/0237412 A1* | 8/2019 | Lee | ............... | H01L 23/3675 |
| 2020/0312770 A1* | 10/2020 | Lu | ............... | H01L 25/105 |
| 2020/0365525 A1* | 11/2020 | Wu | ............... | H01L 25/18 |
| 2021/0118817 A1* | 4/2021 | Wu | ............... | H01L 21/486 |
| 2021/0265231 A1 | 8/2021 | Chang Chien | | |
| 2021/0272914 A1* | 9/2021 | Chen | ............... | H01L 23/16 |
| 2022/0278056 A1* | 9/2022 | Zhao | ............... | H01L 23/16 |

OTHER PUBLICATIONS

Final Office Action dated Apr. 8, 2024, issued in U.S. Appl. No. 17/817,705 (copy not provided).

* cited by examiner

METHOD OF MANUFACTURING A SEMICONDUCTOR DEVICE PACKAGE HAVING DUMMY DIES

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules (MCM), for example, or in other types of packaging.

One smaller type of packaging for semiconductors is a flip chip chip-scale package (FcCSP), in which a semiconductor die is placed upside-down on a substrate and bonded to the substrate using bumps. The substrate has wiring routed to connect the bumps on the die to contact pads on the substrate that have a larger footprint. An array of solder balls is formed on the opposite side of the substrate and is used to electrically connect the packaged die to an end application.

Although existing package structures and methods for fabricating package structures have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
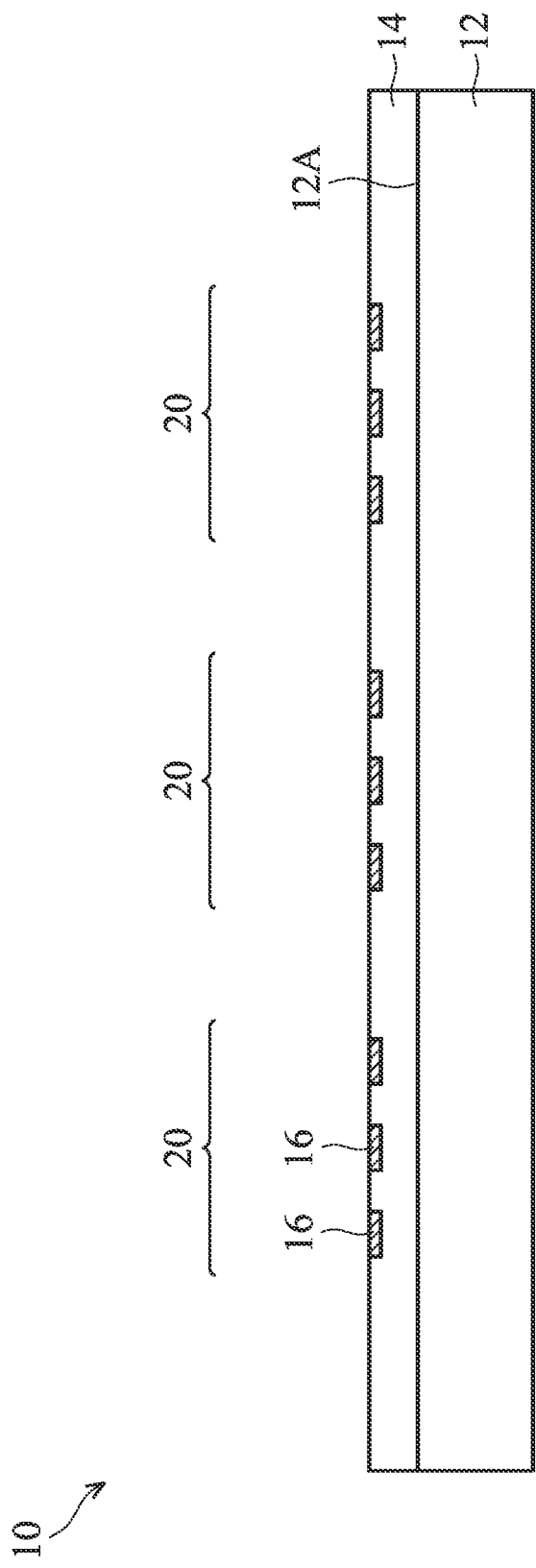
FIGS. 1A-1D are cross-sectional views of various stages of a process for forming a semiconductor device package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g., a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x ±5 or 10%.

A semiconductor device package (structure) including dummy dies and the method for forming the same are provided in accordance with various embodiments of the disclosure. The intermediate stages in the formation of the semiconductor device package are illustrated in accordance with some embodiments. Some variations of some embodiments are discussed. Throughout the various views and illustrative embodiments, like reference numbers are used to designate like elements. In accordance with some embodiments, a semiconductor device package includes at least one dummy die placed between two adjacent functional dies so as to avoid cracks in the substrate by providing support to the substrate when the package undergoes drop reliability testing, for example. In accordance with some embodiments, the dummy dies can also prevent or reduce warpage of the package by reducing the coefficient of thermal expansion (CTE) mismatch between the substrate and the subsequently formed underfill element as the dummy dies have a similar CTE to the substrate and they reduce the amount of the underfill element necessary in the package. Accordingly, the reliability of the semiconductor device package is improved.

Embodiments will be described with respect to a specific context, namely a chip scale package (CSP), particularly flip chip CSP (FcCSP). Other embodiments may also be applied, however, to other packaging techniques, such as flip chip ball grid array (FcBGA) packages and other packaging techniques, such as with an interposer or other active chip in a two and a half dimensional integrated circuit (2.5 DIC) structure or a three dimensional IC (3 DIC) structure. Embodiments discussed herein are to provide examples to enable making or using the subject matter of this disclosure, and a person having ordinary skill in the art will readily understand modifications that can be made while remaining within contemplated scopes of different embodiments. Although method embodiments may be discussed below as being performed in a particular order, other method embodiments contemplate steps that are performed in any logical order.

FIGS. 1A-1D illustrate cross-sectional views of intermediate stages in the formation of a semiconductor device package in accordance with some embodiments of the present disclosure. The corresponding processes are also reflected schematically in the process flow shown in FIG. 6. The semiconductor device package described herein is a multi-chip modules (MCM) package including at least two different functional dies integrated over a fan-out redistribution structure.

FIG. 1A illustrates the formation of a wafer 10, which includes a plurality of package components 20 (see also FIG. 1B) in accordance with some embodiments. The package components 20 may be device dies, packages, or the like. A package component 20 may comprise any number of dies, substrates, transistors, active devices, passive devices, or the like. In some embodiments, the package component 20 includes a substrate 12, which may be a bulk semiconductor substrate, a semiconductor-on-insulator (SOI) substrate, a germanium-on-insulator (GOI) substrate, or the like. The semiconductor substrate is formed of a elementary semiconductor such as silicon or germanium; a compound semiconductor such as silicon germanium, silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; or combinations thereof. Other substrates, such as multi-layered or gradient substrates, may also be used. The substrate 12 may be doped or undoped. Devices, such as transistors, capacitors, resistors, diodes, and the like, may be formed in and/or on an active surface 12A of the substrate 12.

In some embodiments, the package component 20 also includes an interconnect structure 14, which includes one or more dielectric layer(s) and respective metallization pattern(s) formed on the active surface 12A. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform one or more functions. The functions may include memory structures, processing structures, sensors, amplifiers, power distribution, input/output circuitry, or the like. Additionally, conductive features 16, such as conductive pillars (for example, comprising a metal such as copper), are formed in and/or on the interconnect structure 14 to provide an electrical connection to the external circuitry and devices. In some embodiments, the conductive features 16 protrude from the interconnect structure 14 to form pillar structures.

In accordance with some embodiments, a plurality of inter-metallization dielectric (IMD) layers may be formed in the interconnect structure 14. The IMD layers may be formed, for example, of a low-K dielectric material, such as phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), plasma-enhanced CVD (PECVD), high-density plasma chemical vapor deposition (HDP-CVD), or the like. A metallization pattern (or one of the conductive features 16) may be formed in the respective IMD layer, for example, by using photo-lithography techniques to deposit and pattern a photoresist material on the IMD layer to expose portions of the IMD layer that are to become the metallization pattern. An etch process, such as an anisotropic dry etch process, may be used to create recesses and/or openings in the IMD layer corresponding to the exposed portions of the IMD layer. The recesses and/or openings may be lined with a diffusion barrier layer and filled with a conductive material. The diffusion barrier layer may comprise one or more layers of tantalum nitride, tantalum, titanium nitride, titanium, cobalt tungsten, the like, or a combination thereof, deposited by atomic layer deposition (ALD), or the like. The conductive material of the metallization patterns may comprise copper, aluminum, tungsten, silver, and combinations thereof, or the like, deposited by CVD, physical vapor deposition (PVD), or the like. Any excessive diffusion barrier layer and/or conductive material on the IMD layer may be removed, such as by using a chemical mechanical polish (CMP) process.

Figure 1B:
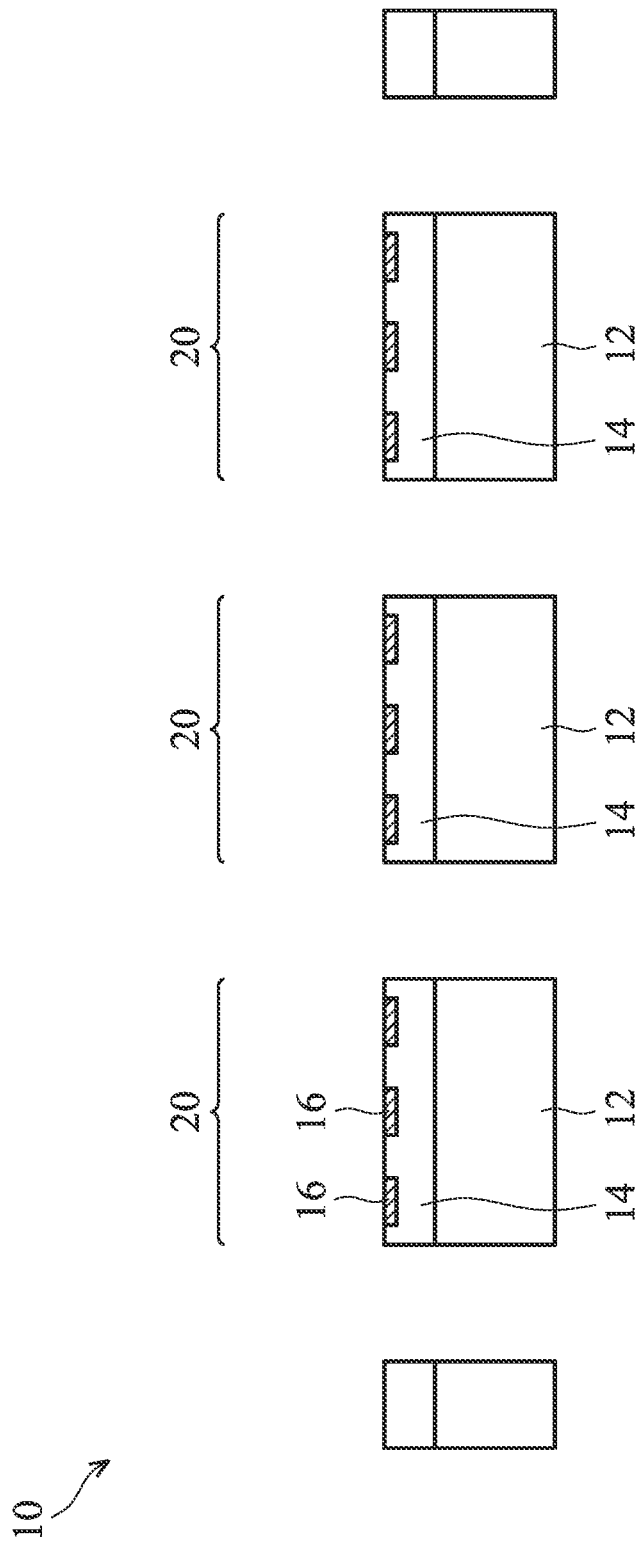

In FIG. 1B, the wafer 10 is singulated into individual package components 20. Typically, the package components 20 contain the same circuitry, such as devices and metallization patterns, although they may also have different circuitry. The singulation process may be through blade sawing, laser dicing, or the like.

In accordance with some embodiments, each of the package components 20 (also called active or functional dies) may include one or more logic dies (e.g., central processing unit, graphics processing unit, field-programmable gate array (FPGA), system-on-chip (SOC) dies, microcontroller, or the like), memory dies (e.g., dynamic random access memory (DRAM) die, static random access memory (SRAM) die, or the like), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof.

Figure 1C:
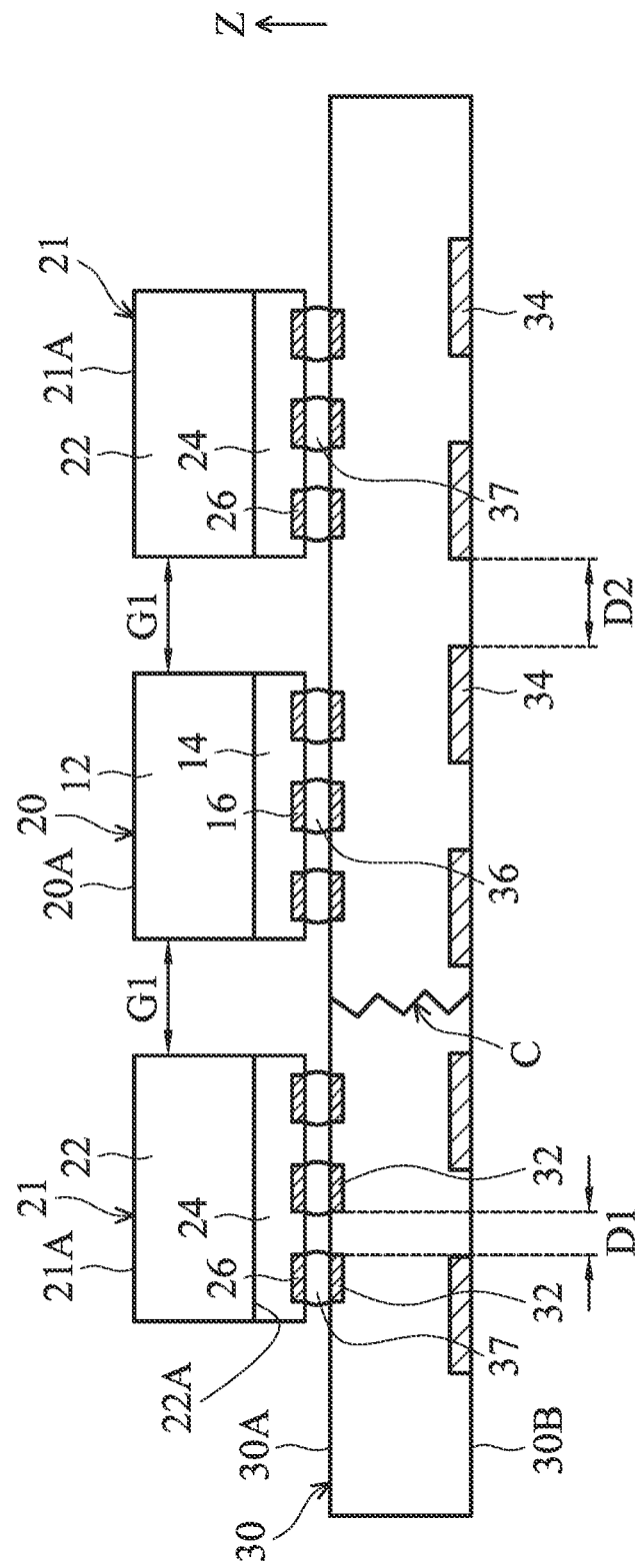
Figure 1D:
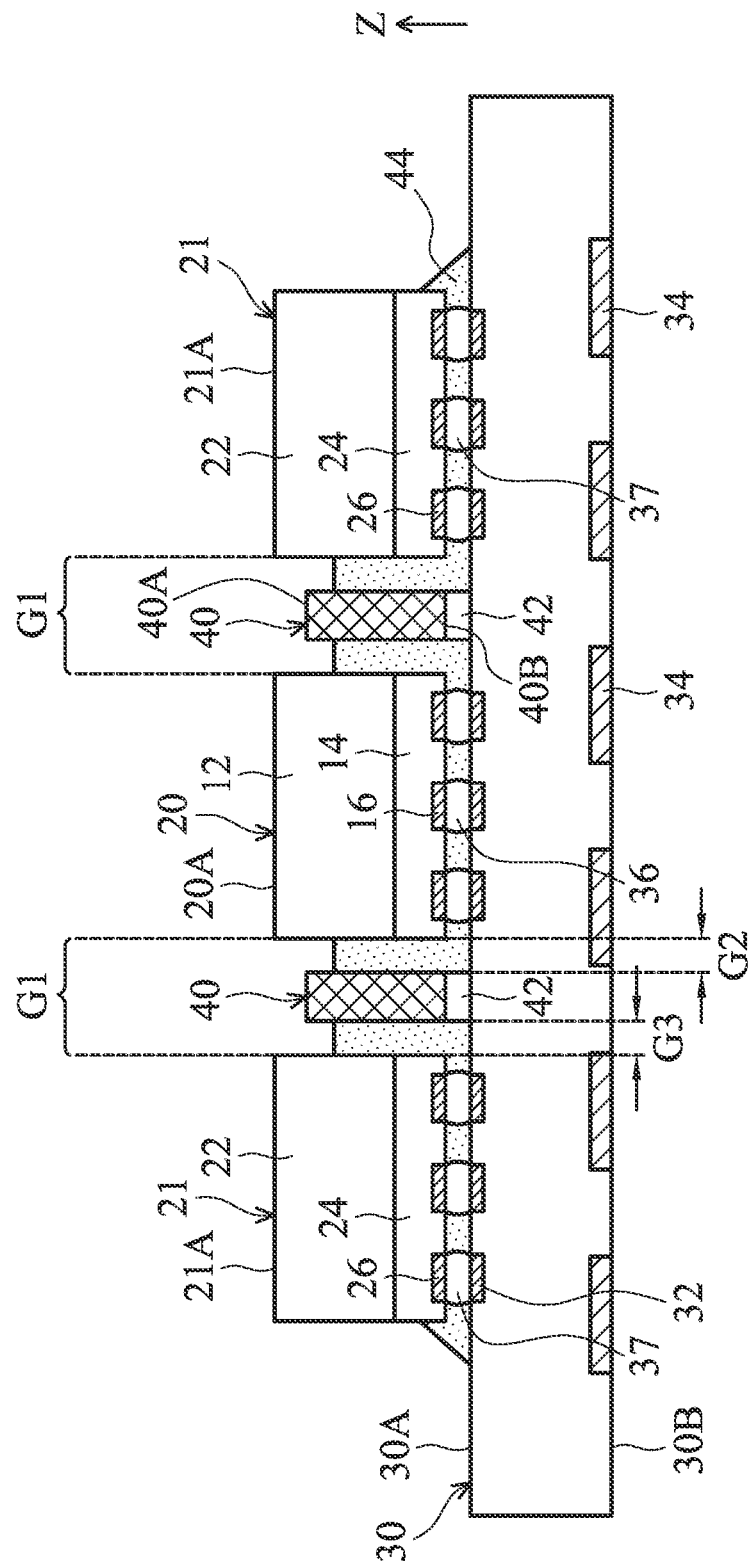
Figure 6:
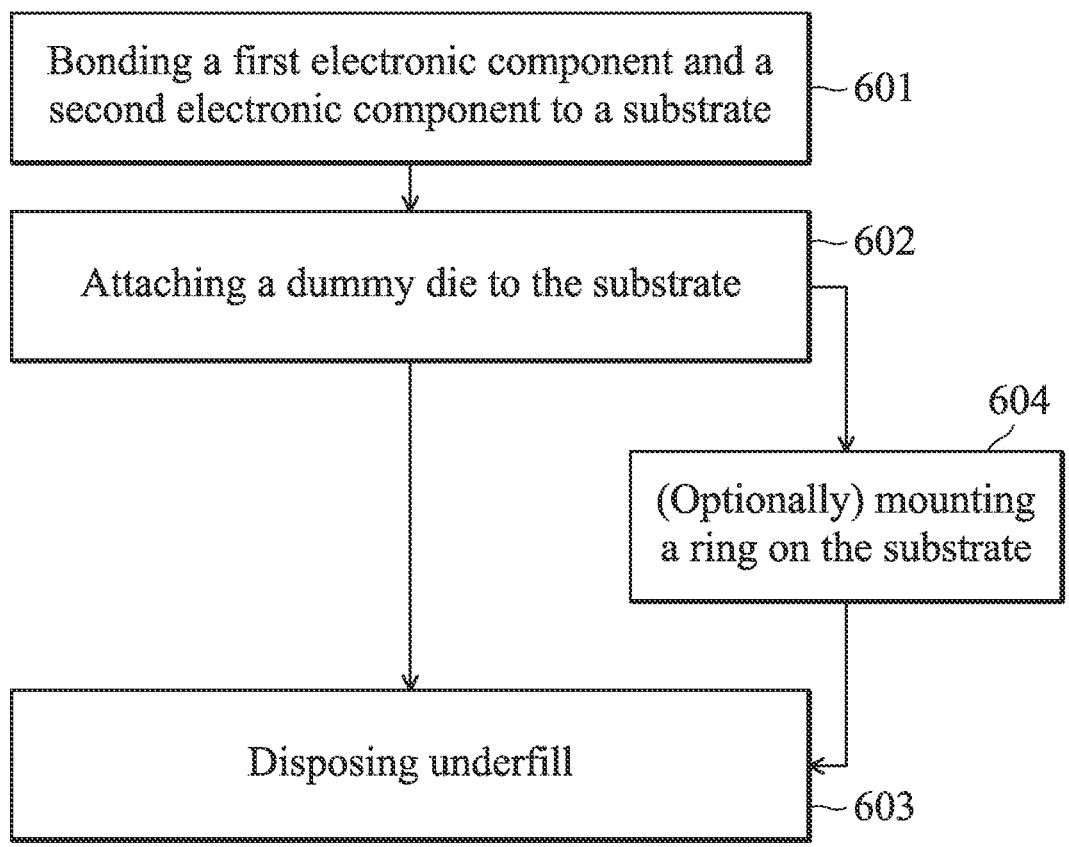
FIG. 6 illustrates a process flow for forming a semiconductor device package in accordance with some embodiments.

FIGS. 1C-1D illustrate cross-sectional views of intermediate stages in the packaging of package components and dummy dies, which are bonded to another package component. The respective processes are shown as process flow 600 as shown in FIG. 6. In FIGS. 1C-1D, a substrate 30 is used an example of the package component, on which other package components are bonded thereon.

The substrate 30 may be used to provide electrical connection between semiconductor devices packaged in the semiconductor device package (which will be described later) and the external circuitry and devices (not shown). In some embodiments, the substrate 30 is an interposer substrate which is free from active devices (such as transistors and diodes) and passive devices (such as resistors, capacitors, inductors, or the like) therein. In some alternative embodiments, the substrate 30 is a device substrate which includes active and/or passive devices thereon or therein. The substrate 30 may be a semiconductor substrate or a dielectric substrate. While being a semiconductor substrate, the substrate 30 may be a bulk semiconductor substrate, a silicon-on-insulator (SOI) substrate, a germanium-on-insulator (GOI) substrate, or the like. The semiconductor material of the substrate 30 may be silicon, germanium; a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 30 may be doped or undoped. In some other embodiments, the substrate 30 may be a package substrate, which may include a core or may be a core-less substrate. The package substrate may be a printed circuit board (PCB), a ceramic substrate, or another suitable package substrate.

As shown in FIG. 1C, the substrate 30 has a first surface 30A facing the subsequently attached package components, and a second surface 30B opposite the first surface 30A. Contact pads 32 may be formed on or exposed from the first surface 30A and used to electrically connect to the subsequently attached package components. Contact pads 34 may be formed on or exposed from the second surface 30B and used to electrically connect to the external circuitry and devices (e.g., a PCB) through an array of solder balls (not shown). Although not shown, the substrate 30 may also include redistribution lines (e.g., vias and/or traces) therein to interconnect the contact pads 32 and 34 and/or the devices thereon. The materials or formation method of the redistribution lines (as well as the contact pads 32 and 34) may be the same or similar to those of the metallization pattern(s) of the interconnect structure 14 illustrated in FIG. 1A. In some embodiments, there is a first distance D1 between two adjacent contact pads 32, and a second distance D2 between two adjacent contact pads 34. The second distance D2 is greater than the first distance D1. Accordingly, the substrate 30 is also referred as a fan-out redistribution substrate.

In FIG. 1C, package components 20 and 21 are bonded to the first surface 30A of the substrate 30, for example, through flip-chip bonding by way of the electrical connectors therebetween (which will be described later). The respective process is illustrated as process 601 in the process flow 600 shown in FIG. 6. The package components 20 and 21 may be placed over the substrate 30 using, for example, a pick-and-place tool. In some embodiments, the package components 20 and 21 are arranged side by side (for example, a package component 20 is located between two package components 21) on the substrate 30 with a gap G1 between adjacent package components 20 and 21, as shown in FIG. 1C.

The package components 21 may be formed through similar processing as described above with reference to package components 20. In accordance with some embodiments, the package components 21 include one or more memory dies, such as a stack of memory dies (e.g., DRAM dies, SRAM dies, High-Bandwidth Memory (HBM) dies, Hybrid Memory Cubes (HMC) dies, low-power (LP) double data rate (DDR) memory modules, or the like). In cases where the package components 21 includes a stack of memory dies, it can include both memory dies and a memory controller die, such as a stack of four or eight memory dies with a memory controller die. In some embodiments, the package components 21 may be the same size (for example, same heights and/or surface areas), and in some other embodiments, the package components 21 may be different sizes (for example, different heights and/or surface areas). In accordance with some embodiments, the package components 20 and 21 are different types of electronic components that provide different functions. For example, a package component 20 may be a processor die and a package component 21 may be a memory die in some cases.

In accordance with some embodiments, the package component 20 may have the same or similar height, in a vertical direction Z perpendicular to the first surface 30A, as those of the package components 21 (as shown in FIG. 1C). In some other embodiments, the package components 20 and 21 may be of different heights.

In some embodiments as shown in FIG. 1C, a package component 21 includes a main body 22, an interconnect structure 24, and conductive features 26. The main body 22 of the package component 21 may comprise any number of dies, substrates, transistors, active devices, passive devices, or the like. In some embodiments, the main body 22 is a bulk semiconductor substrate, a semiconductor-on-insulator (SOI) substrate, a germanium-on-insulator (GOI) substrate, a multi-layered semiconductor substrate, or the like. The semiconductor material of the main body 22 may be selected from the similar candidate materials and structure of the substrate 12 of the package component 20. Devices, such as transistors, capacitors, resistors, diodes, and the like, may be formed in and/or on an active surface 22A of the main body 22.

The interconnect structure 24 comprising one or more dielectric layer(s) and respective metallization pattern(s) formed on the active surface 22A. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform electrical functions. Additionally, conductive features 26, such as conductive pillars (for example, comprising a metal such as copper), are formed in and/or on the interconnect structure 24 to provide an electrical connection to the external circuitry and devices. In accordance with some embodiments, the conductive features 26 protrude from the interconnect structure 24 to form pillar structures to be utilized when bonding the package component 21 to the substrate 30.

In FIG. 1C, the package components 20 and 21 are bonded to and electrically connected to the first surface 30A of the substrate 30 through electrical connectors 36 between the respective package component 20 and the substrate 30 and electrical connectors 37 between the respective package component 21 and the substrate 30. The bonding between package components 20 and 21 and the substrate 30 may be solder bonding or direct metal-to-metal (such as a copper-to-copper) bonding. The electrical connectors 36 and 37 may include conductive pillars, solder bumps, solder balls, one or more other suitable conductive elements, or a combination thereof.

In some embodiments, the electrical connectors 36 and 37 are made of or include a metal material, such as copper, aluminum, gold, nickel, silver, palladium, the like, or a combination thereof. Before the bonding, the electrical connectors 36/37 may be formed on the exposed conductive features 16/26 of the respective package component 20/21 using an electroplating process, an electroless plating process, a placement process, a printing process, a physical vapor deposition (PVD) process, a chemical vapor deposition (CVD) process, a photolithography process, one or more other applicable processes, or a combination thereof.

In some other embodiments, the electrical connectors 36 and 37 are made of a tin-containing material. The tin-containing material may include nickel, tin, tin-lead, gold, copper, silver, palladium, indium, nickel-palladium-gold, nickel-gold, the like, or a combination thereof. In some embodiments, the electrical connectors 36 and 37 are lead-free. Before the bonding, the electrical connectors 36/37 may be formed on the exposed conductive features of the respective package component 20/21, the corresponding contact pads 32 of the substrate 30, or both using a plating process, such as an electroplating process. In addition, a reflow process may be performed in order to shape the tin-containing material into the desired bump or ball shapes.

In FIG. 1D, dummy dies 40 are adhered to the first surface 30A of the substrate 30. The respective process is illustrated as process 602 in the process flow 600 shown in FIG. 6. The dummy dies 40 may be placed over the substrate 30 using, for example, a pick-and-place tool.

The dummy dies 40 may be made of silicon, a dielectric material, a metal material such as copper or stainless steel, the like, or a combination thereof. In accordance with some embodiments, the dummy dies 40 are blank dies, with the entirety formed of a homogeneous material such as silicon. No active devices, passive devices, functional circuitry, or the like are formed in the dummy dies 40 in some embodiments. The dummy dies 40 do not have electrical functions. In some alternative embodiments, the dummy dies 40 are defective active dies that have been recycled as dummy dies 40. In accordance with some embodiments, the dummy dies 40 is bulk metal, with the entirety formed of a homogeneous high-modulus material such as copper or stainless steel.

As shown in FIG. 1D, at least one dummy die 40 is disposed over the substrate 30 between every adjacent package components 20 and 21 with a gap G2 between the dummy die 40 and the adjacent package component 20 and a gap G3 between the dummy die 40 and the adjacent package component 21, in accordance with some embodiments. The dummy dies 40 are extended in the vertical direction Z, and the sidewalls thereof are substantially vertical to the first surface 30A of the substrate 30 (i.e., each dummy die 40 has rectangular cross-sectional shape). In some embodiments, the heights of the dummy dies 40 (such as in the vertical direction Z) may be substantially equal to or less than the heights of either one or both of the package components 20 and 21.

FIGS. 2A-2E illustrate plane views (such as top views) of semiconductor device packages including dummy dies 40 being disposed on the substrate 30 in accordance with some embodiments. In FIGS. 2A-2E, "SOC" and "DRAM" are marked as example package components 20 and 21, respectively. It should be appreciated that the package components 20 and 21 may be any other types of electronic components whenever applicable. Additionally, one package component 20 is surrounded by four package components 21 in FIGS. 2A-2E; however, other numbers and arrangements of the package components 20 and 21 may also be used.

Figure 2A:
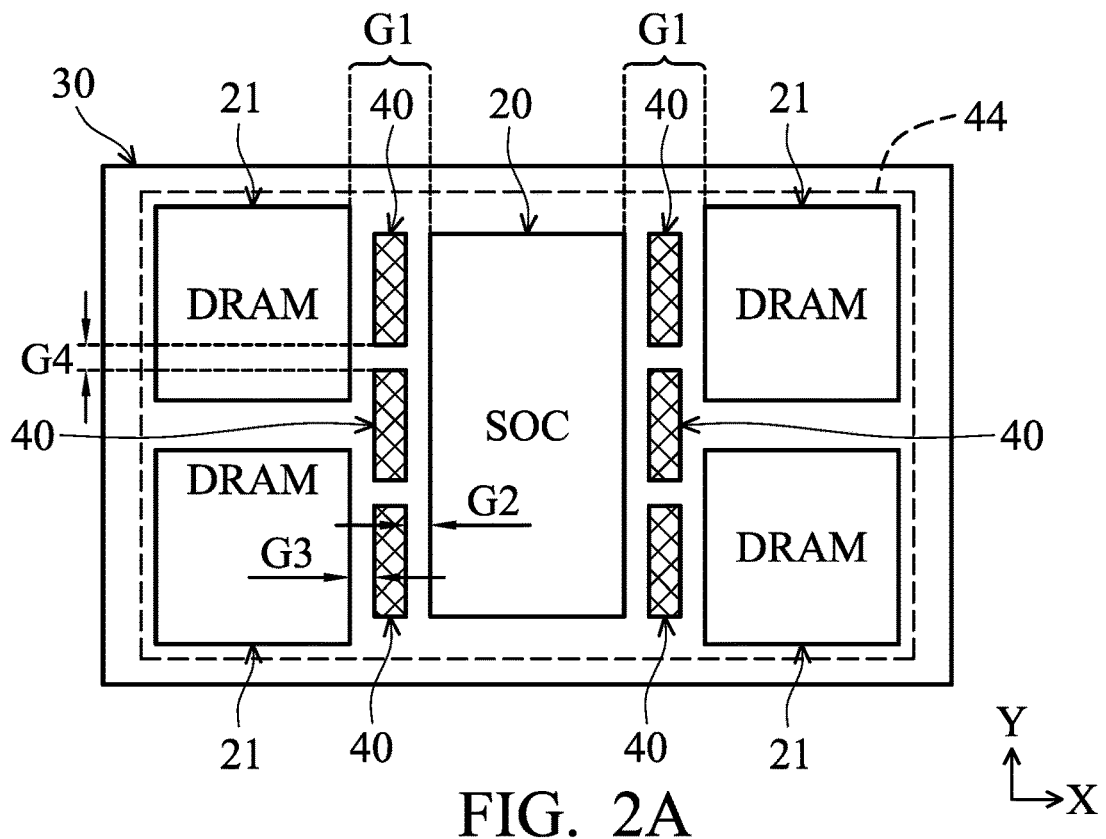
FIGS. 2A-2E are plane views of semiconductor device packages in accordance with some embodiments.
Figure 2B:
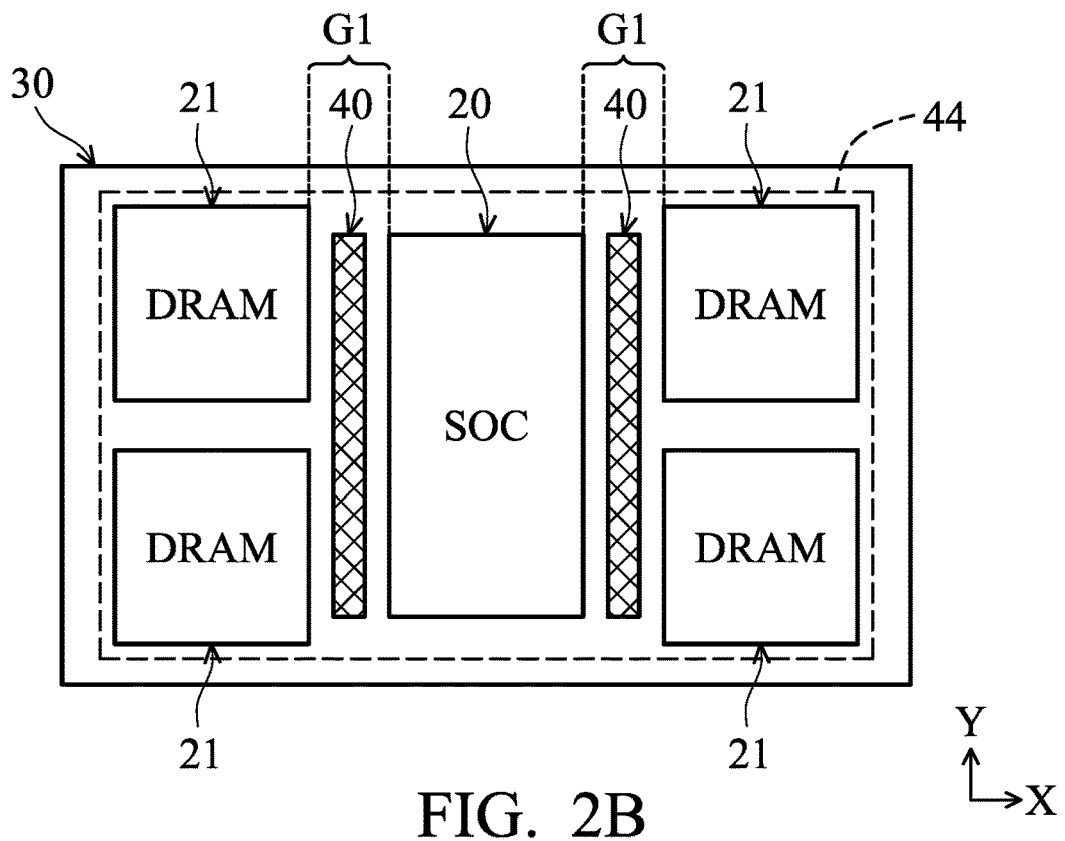
Figure 2C:
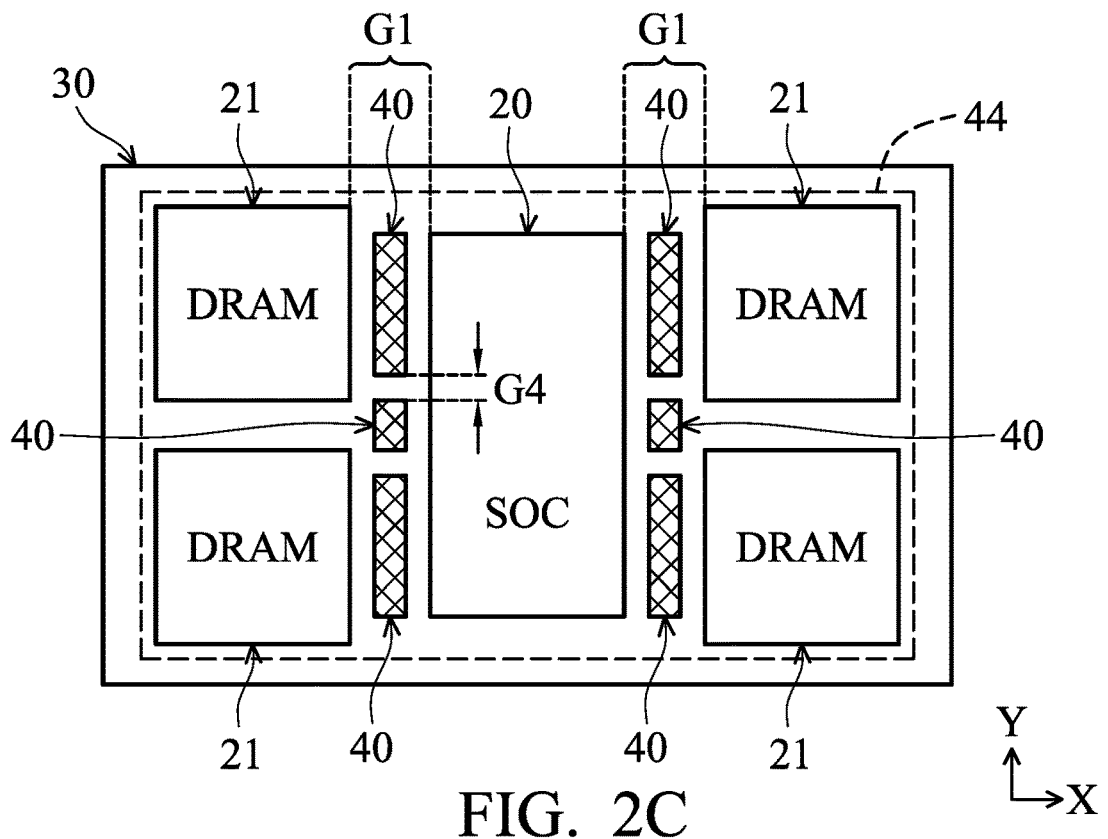
Figure 2D:
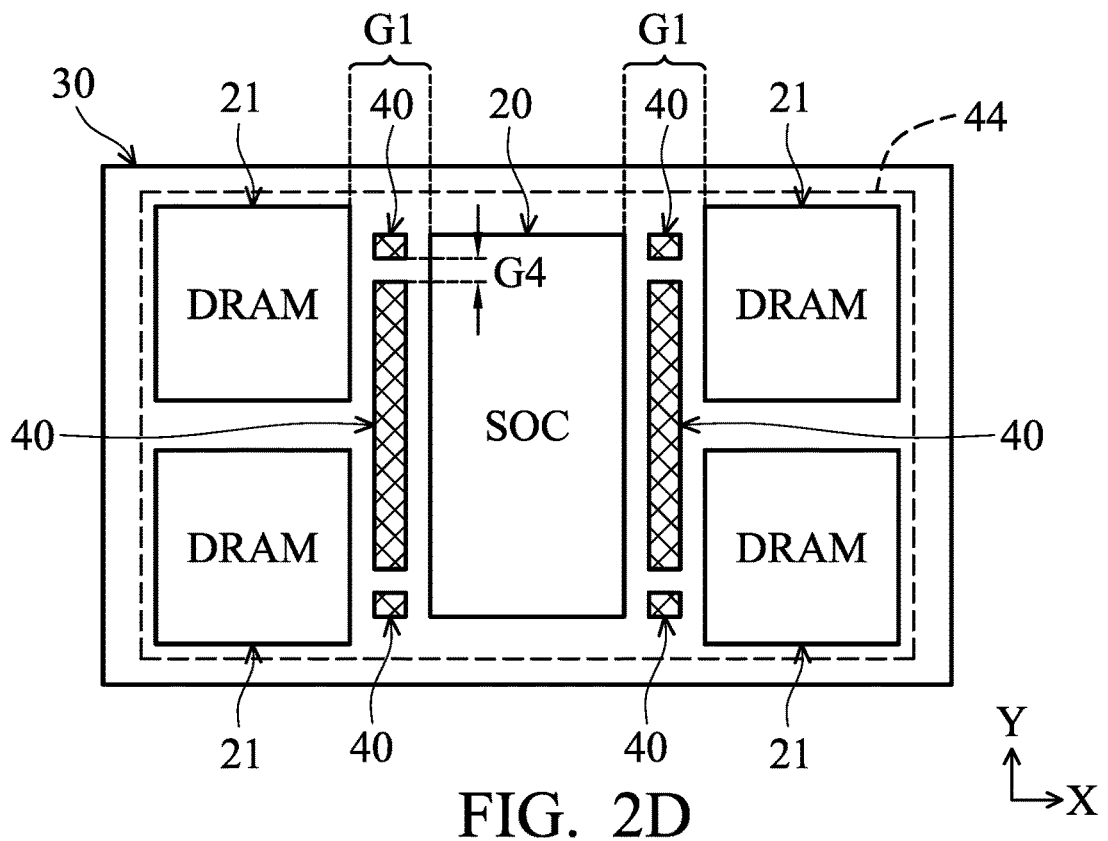
Figure 2E:
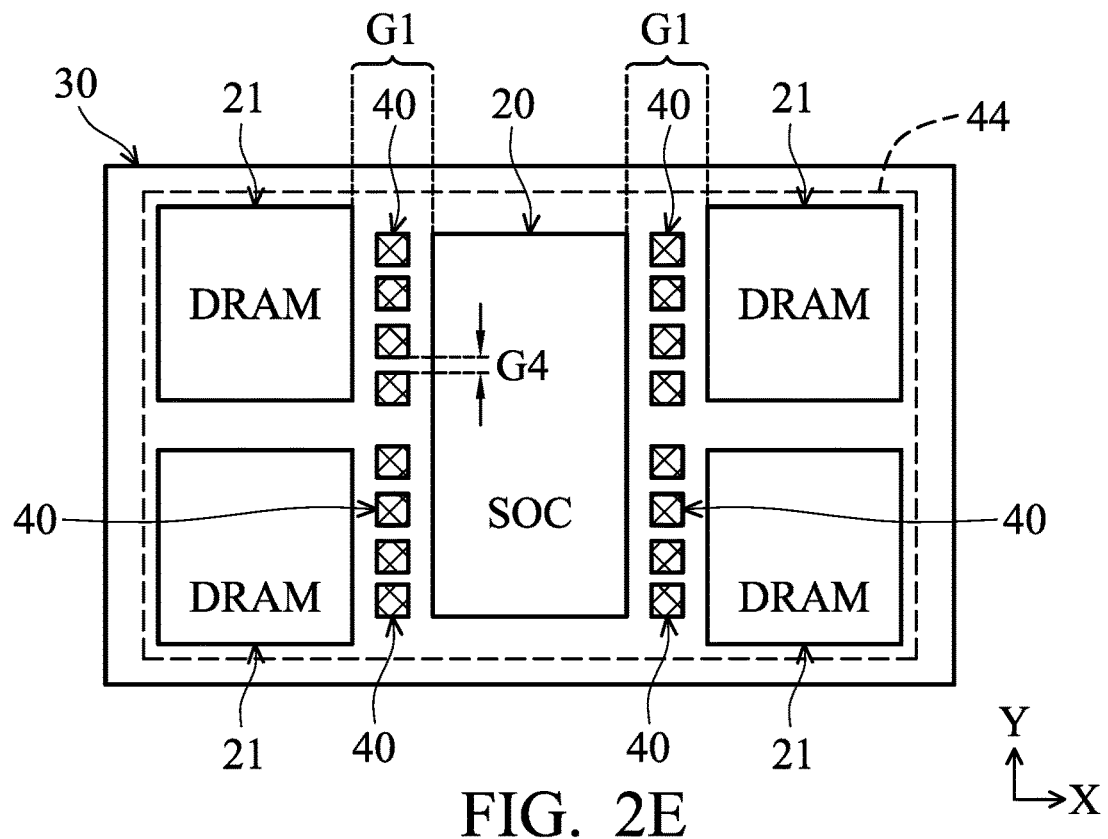
Figure 3A:
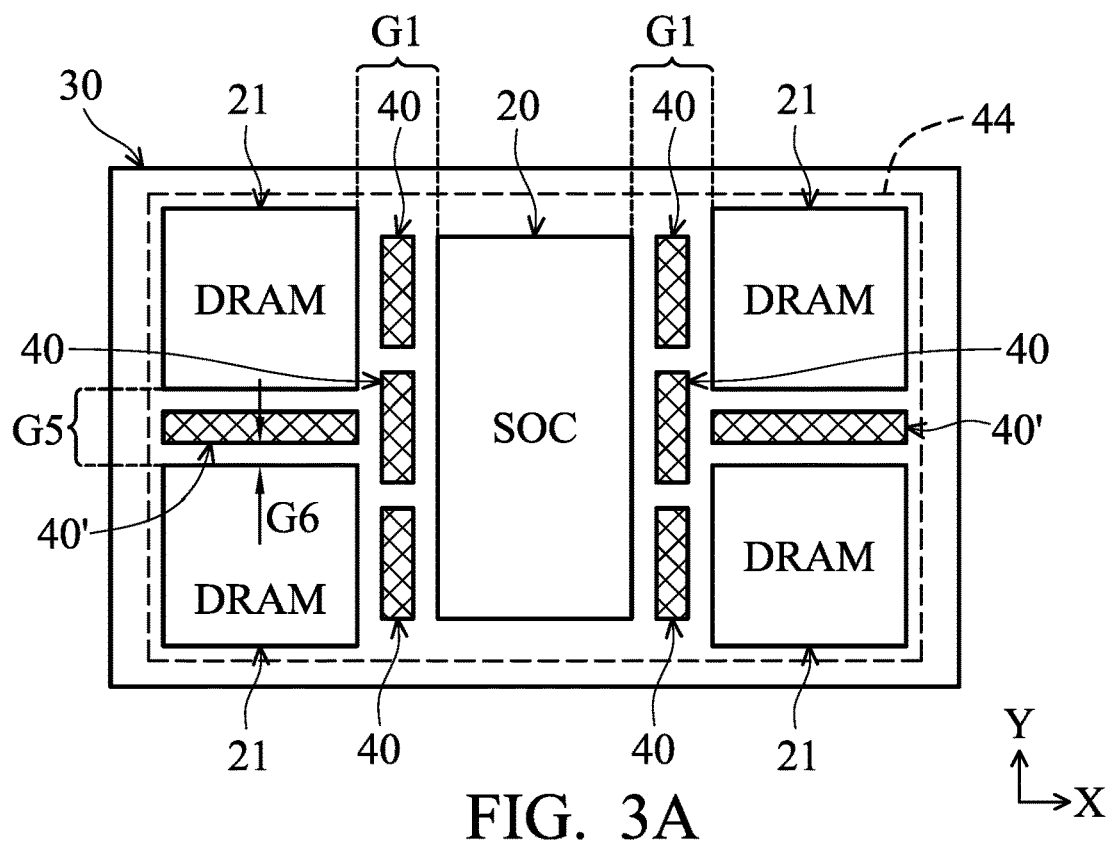
FIGS. 3A-3E are plane views of semiconductor device packages in accordance with some embodiments.
Figure 3B:
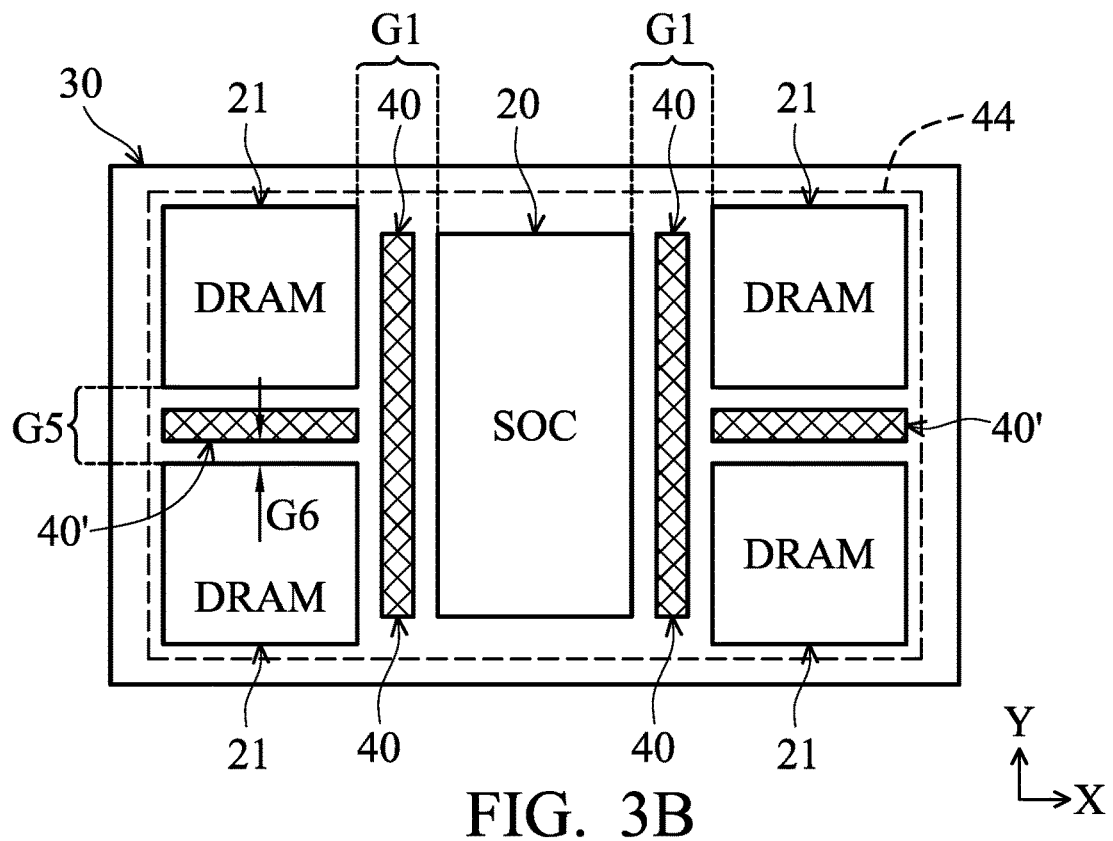
Figure 3C:
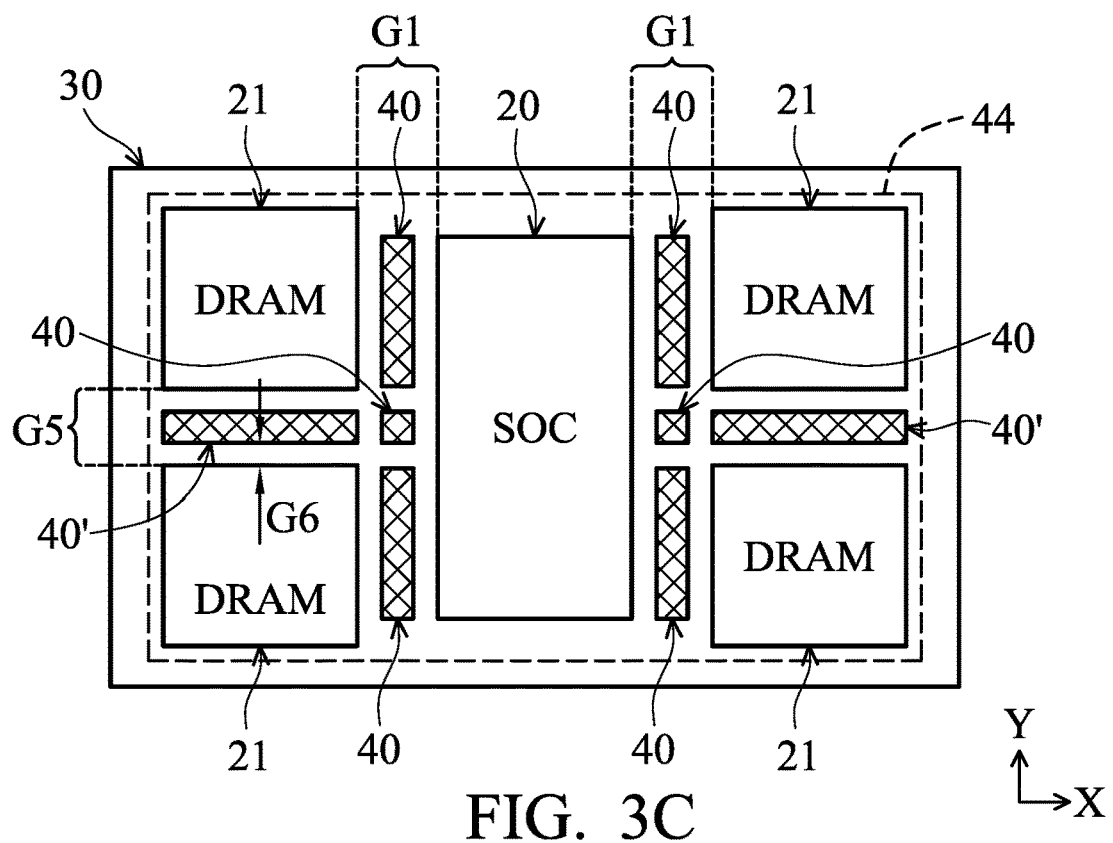
Figure 3D:
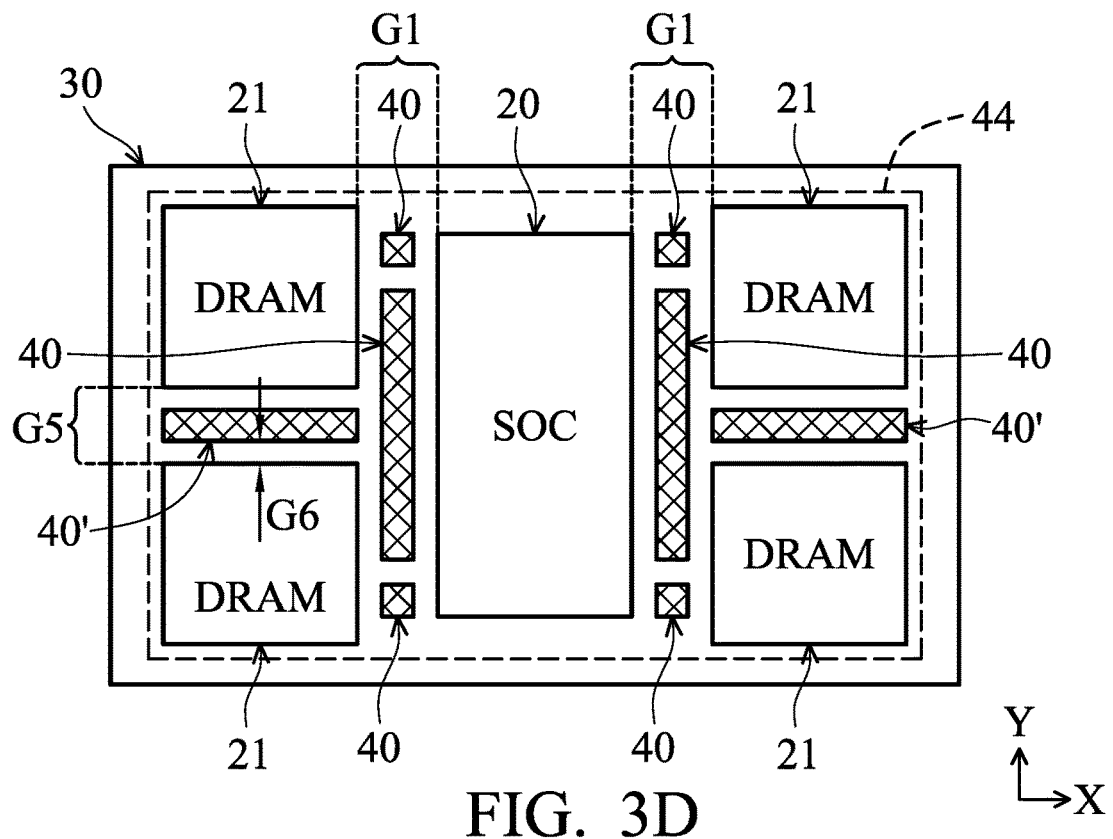
Figure 3E:
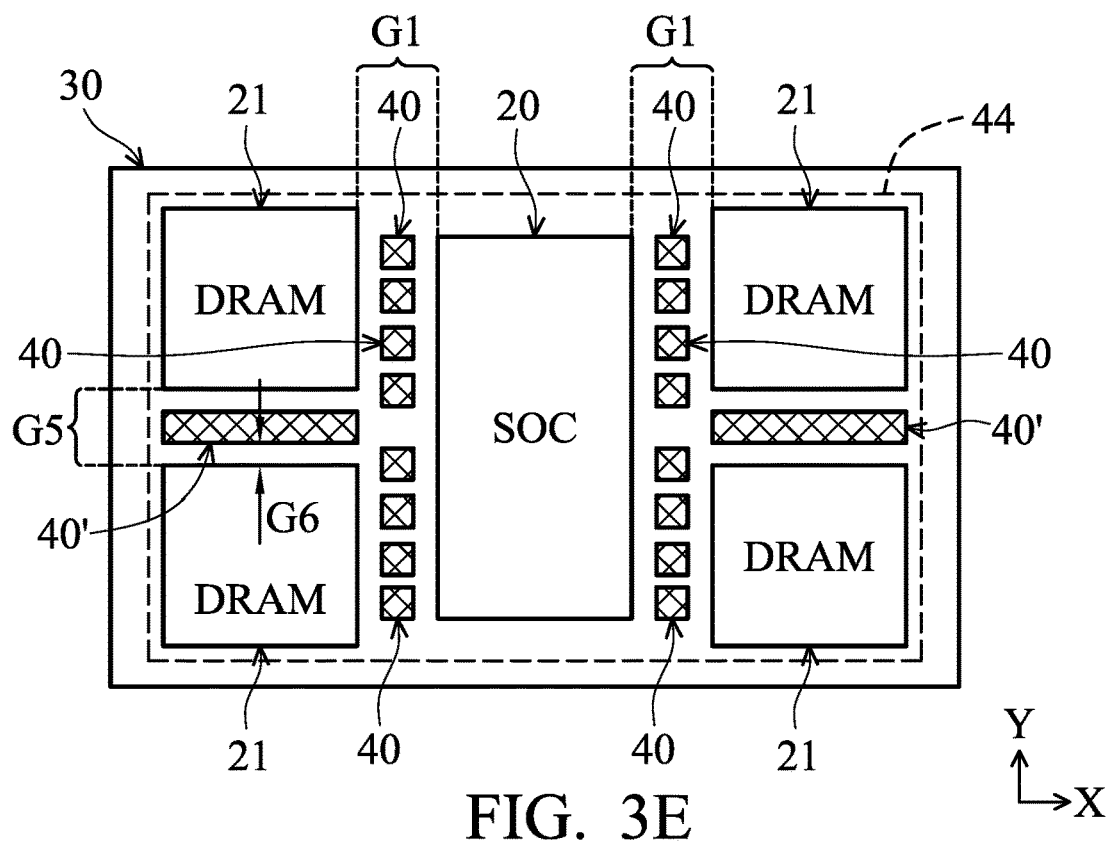

In FIG. 2A, the dummy dies 40 are respectively provided on opposite sides of the package component 20 and in the gaps G1 (e.g., two gaps G1) between adjacent package components 20 and 21. Each of the gaps G1 extends in a first direction (such as the direction Y in the figure). Several (e.g., three) dummy dies 40 disposed in a gap G1 are arranged in the first direction with a gap G4 between every adjacent dummy dies 40. Each of the dummy dies 40 has a lengthwise direction extending in the first direction. The combined length of the dummy dies 40 in a gap G1 is substantially equal to the length of the package component 20 in the first direction. In FIG. 2B, there is one dummy die 40 disposed in a gap G1 between adjacent package components 20 and 21. The dummy die 40 has a lengthwise direction extending in the first direction (such as the direction Y in the figure), and the length of the dummy die 40 is substantially equal to the length of the package component 20 in the first direction. In FIG. 2C, the arrangement of the dummy dies 40 is similar to the embodiment of FIG. 2A, except that in each gap G1, the length (in the first direction, such as the direction Y in the figure) of a central dummy die 40 is less than that of the peripheral dummy dies 40. The central dummy die 40 may have a rectangular or square shape. In FIG. 2D, the arrangement of the dummy dies 40 is similar to the embodiment of FIG. 2A, except that in each gap G1, the length (in the first direction, such as the direction Y in the figure) of a central dummy die 40 is greater than that of the peripheral dummy dies 40. Each of the peripheral dummy dies 40 may have a rectangular or square shape. In FIG. 2E, the arrangement of the dummy dies 40 is similar to the embodiment of FIG. 2A, except that each of the dummy dies 40 is changed to a square. The combined length of the dummy dies 40 (e.g., eight dummy dies 40) in a gap G1 is substantially equal to the length of the package component 20 in the first direction (such as the direction Y in the figure).

The dummy dies 40 being placed between every adjacent package components 20 and 21 can help to avoid cracks C (see FIG. 1C, for example) in the substrate 30 when the semiconductor device package undergoes drop reliability testing, for example. A significant part of the crack C occur due to that there is a relatively larger gap G1 (for example, a width of about 1 mm) between every adjacent package components 20 and 21, in which an underfill element 44 will be subsequently filled (which will be described later), and stress tends to concentrate in these regions. In accordance with some embodiments, the dummy dies 40 have a greater modulus of elasticity than the underfill element 44. Accordingly, the dummy dies 40 are rigid to support the substrate 30 during the drop reliability testing so that the cracks C can be reduced or prevented.

Additionally, in accordance with some embodiments, the dummy dies 40 can also prevent warpage of the package structure by reducing the coefficient of thermal expansion (CTE) mismatch between the substrate 30 and the subsequently formed underfill element 44 (see FIG. 1D) as the dummy dies 40 have a similar CTE to the substrate 30 (for example, both the substrate 30 and dummy dies 40 may be made of silicon and thus have similar CTEs) and the dummy dies 40 can reduce the amount of underfill element 44 necessary in the package.

Referring back to FIG. 1D, each of the dummy dies 40 is attached to the first surface 30A of the substrate 30 with an attaching structure 42. It should be appreciated that, unlike the package components 20 and 21 being electrically coupled to the internal circuitry of the substrate 30, the dummy dies 40 are electrically isolated from the substrate 30. In accordance with some embodiments, the attaching structures 42 are adhesives that adhere the dummy dies 40 to the substrate 30. The adhesive may be any suitable adhesive, epoxy, die attach film (DAF), or the like. The adhesive may be applied to a bottom surface 40B of the dummy dies 40 or may be applied over the first surface 30A of the substrate 30 in some embodiments.

In some other embodiments, the attaching structures 42 includes metal pillars with metal cap layers (sometimes referred to as micro bumps) that bond the dummy dies 40 to the substrate 30. The micro bumps may be formed on the bottom surfaces 40B of the dummy dies 40, the first surfaces 30A of the substrate 30, or both. The micro bumps may be formed at the same time as the micro bumps (e.g. electrical connectors 36 and 37) that bond the package components 20 and 21. The micro bumps (such as the attaching structures 42) of the dummy dies 40 can be reflowed together with the electrical connectors 36 and 37 of the package components 20 and 21 in some embodiments.

Still referring to FIG. 1D, an underfill element 44 is dispensed into the gaps between the substrate 30, the package components 20/21, and the dummy dies 40. The respective process is illustrated as process 603 in the process flow 600 shown in FIG. 6. The underfill element 44 is disposed to surround and protect the electrical connectors 36/37 below the package components 20/21 (for example, the underfill element 44 fills the whole gap between each package component 20/21 and the underlying substrate 30) and the attaching structures 42 below the dummy dies 40, to enhance the connection between the package components 20, 21, the dummy dies 40, and the underlying substrate 30 and therefore the strength of the overall package structure. In some embodiments, the underfill element 44 extends up along the sidewalls of package components 20, 21 and the dummy dies 40. The top surfaces 20A, 21A of the package components 20, 21 and the top surfaces 40A of the dummy dies 40 may be exposed from the underfill element 44 for heat dissipation, but embodiments of the disclosure are not limited thereto.

The underfill element 44 may be made of or include an insulating material such as an underfill material. The underfill material may include an epoxy, a resin, a filler material, a stress release agent (SRA), an adhesion promoter, another suitable material, or a combination thereof. In accordance with some embodiments, an underfill material in liquid state is dispensed into the gaps between the substrate 30, the package components 20/21, and the dummy dies 40 by a capillary flow process, after the package components 20, 21 and the dummy dies 40 are attached. In accordance with some embodiments, the gaps (e.g., gaps G2, G3 and G4) between each dummy die 40 and other adjacent package component 20/21 or dummy die 40 can be at least greater than about 0.5 mm to facilitate the flowing of the underfill material. After the dispensing, the underfill material is cured to form the underfill element 44.

In FIG. 1D, the resulting semiconductor device package (e.g., a MCM package including dummy dies) formed according to the process flow 600 shown in FIG. 6 in accordance with some embodiments is illustrated.

Many variations and/or modifications can be made to embodiments of the disclosure. FIGS. 3A-3E are plane views (such as top views) of semiconductor device packages in accordance with some embodiments. In these embodiments, there are additional dummy dies 40' disposed on the substrate 30 (for example, through the attaching structures 42 illustrated in FIG. 1D), and the other configurations are the same or similar to those of the embodiments of FIGS. 2A-2E discussed above. The dummy dies 40' may have a material and structure similar to those of the dummy dies 40 described above, and are also electrically isolated from the substrate 30.

In FIGS. 3A-3E, the dummy dies 40' are respectively disposed in the gaps G5 (e.g., two gaps G5) between adjacent package components 21 (for example, package components of the same type). Each of the gaps G5 extends along a second direction (such as the direction X in the figures). There is one dummy die 40' disposed in a gap G5, and the dummy die 40' has lengthwise direction extending in the second direction. The length of the dummy die 40' in a gap G5 is substantially equal to the length of the package components 21 in the second direction. The gaps G6 between each dummy die 40' and the adjacent package component 21 can be at least greater than about 0.5 mm to facilitate the flowing of the underfill material (such as the underfill element 44 illustrated in FIG. 1D). One of ordinary skill in the art will appreciate that the embodiments of FIGS. 3A-3E are provided for illustrative purposes, and other configurations of the dummy dies 40' may also be used in different embodiments. For example, there may be two or more dummy dies 40' placed in a gap G5.

Similar to the dummy dies 40, the dummy dies 40' being placed between every adjacent package components 21 can help to avoid cracks in the substrate 30 when the semiconductor device package undergoes drop reliability testing, for example. In accordance with some embodiments, the dummy dies 40' have a greater modulus of elasticity than the underfill element 44 (see FIG. 1D). Accordingly, the dummy dies 40' are rigid to support the substrate 30 during the drop reliability testing so that the cracks can be reduced or prevented. Additionally, in accordance with some embodiments, the dummy dies 40' can also prevent warpage of the package structure by reducing the CTE mismatch between the substrate 30 and the subsequently formed underfill element 44 as the dummy dies 40' have a similar CTE to the substrate 30 (for example, both the substrate 30 and dummy dies 40' may be made of silicon and thus have similar CTEs) and the dummy dies 40' can reduce the amount of underfill element 44 necessary in the package.

Figure 4A:
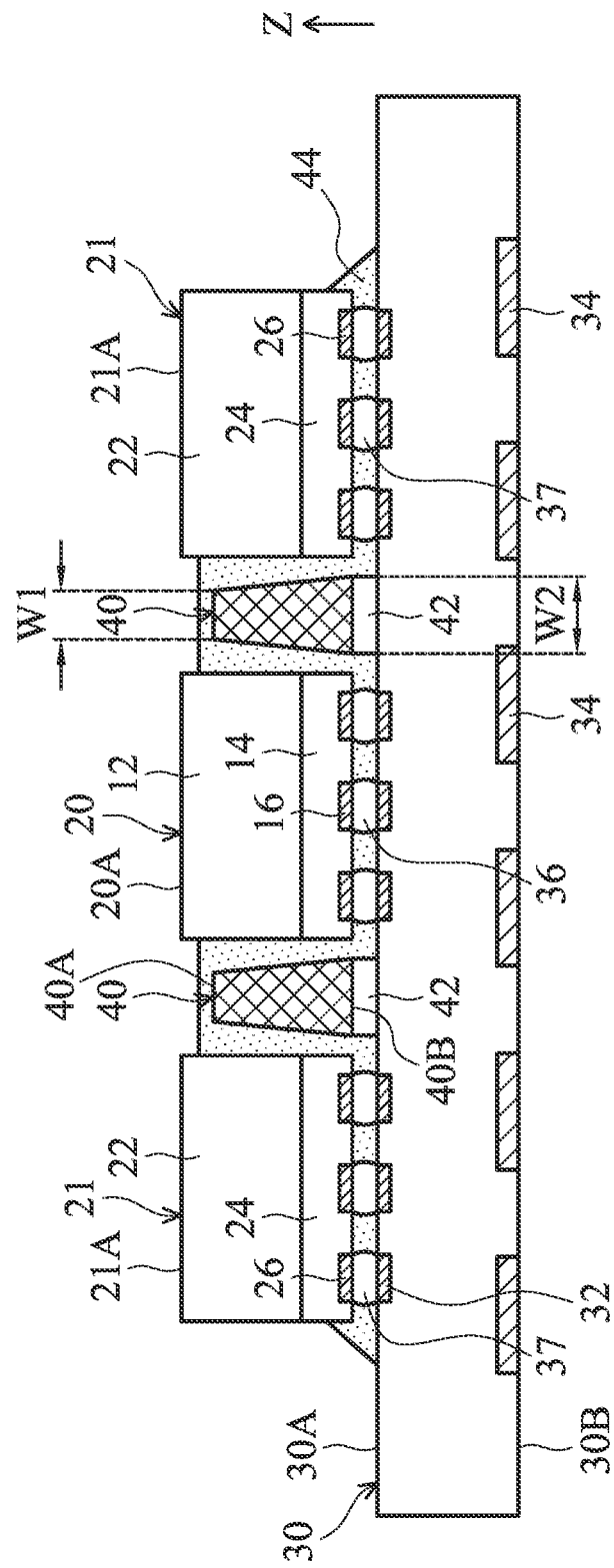
FIGS. 4A-4C are cross-sectional views of semiconductor device packages in accordance with some embodiments, wherein the dummy dies have different cross-sectional shapes.
Figure 4B:
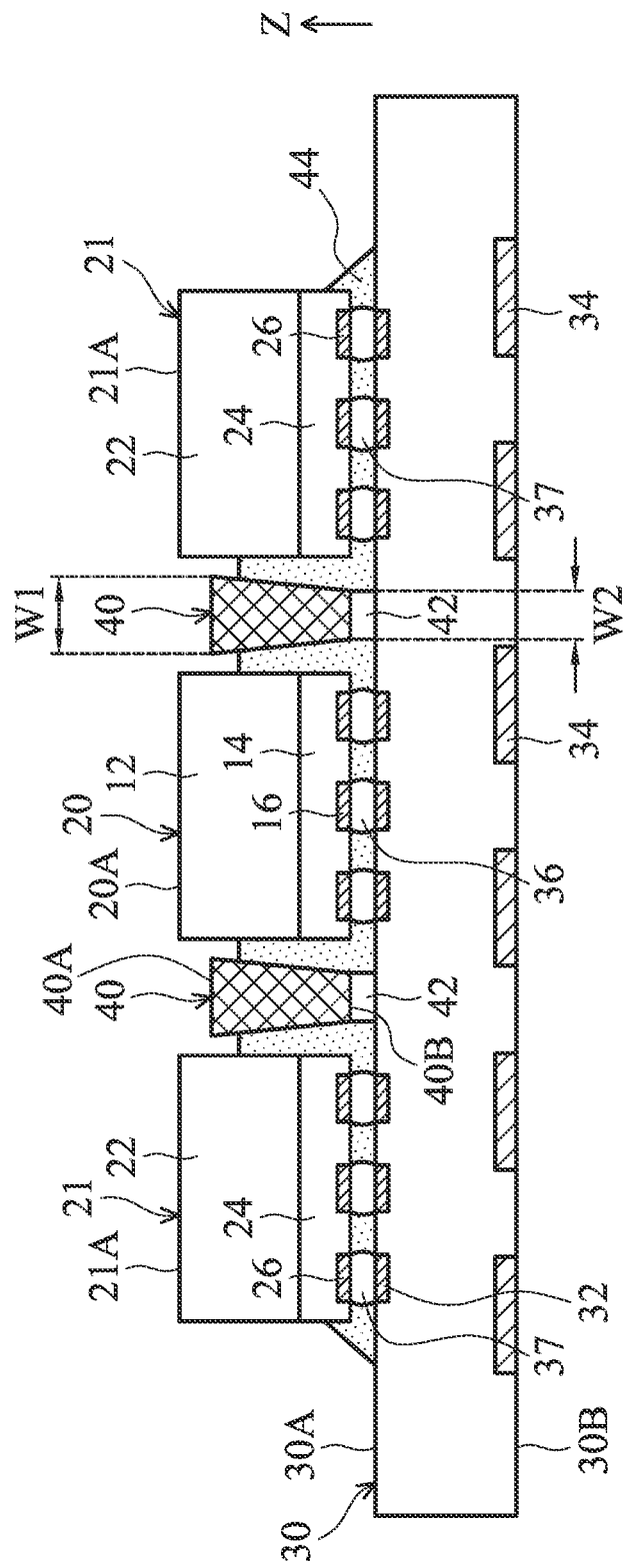
Figure 4C:
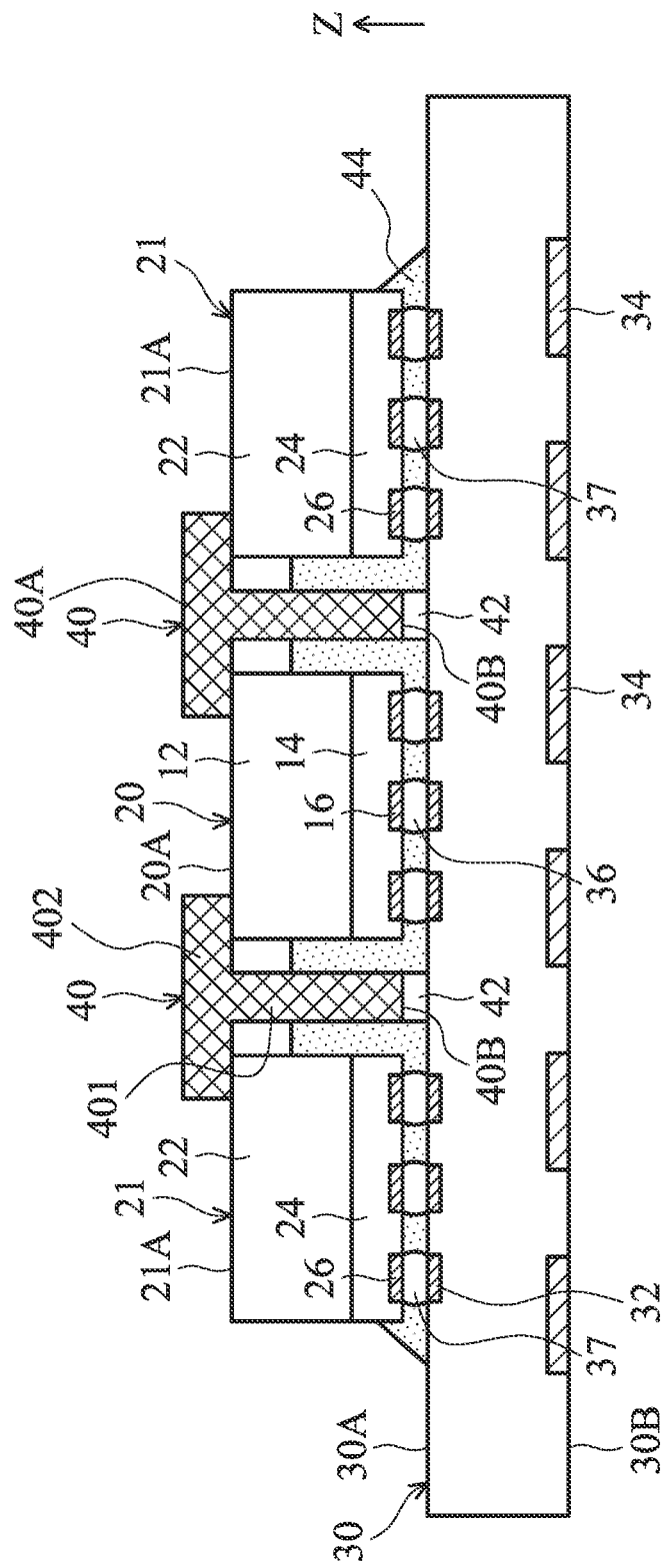

FIGS. 4A-4C are cross-sectional views illustrating different cross-sectional shapes (such as compared to the embodiments shown in FIG. 1D) of the dummy dies 40 in accordance with some embodiments. In FIG. 4A, the sidewalls of the dummy dies 40 are inclined relative to the first surface 30A of the substrate 30, and for each dummy die 40, the sectional size W1 (for example, width) of the top surface 40A is smaller than the sectional size W2 (for example, width) of the bottom surface 40B. Due to the smaller upper portion, the dummy dies 40 can facilitate the flowing of the underfill material. In some embodiments, the underfill element 44 extends up along the sidewalls of package components 20, 21 and the dummy dies 40 and covers the top surfaces 40A of the dummy dies 40 (i.e., the dummy dies 40 are buried in the underfill element 44), as shown in FIG. 4A. In FIG. 4B, the sidewalls of the dummy dies 40 are inclined relative to the first surface 30A of the substrate 30, and for each dummy die 40, the sectional size W1 (for example, width) of the top surface 40A is greater than the sectional size W2 (for example, width) of the bottom surface 40B. Due to the larger upper portion, the dummy dies 40 can reduce the amount of the underfill element 44 necessary in the package.

In FIG. 4C, each of the dummy dies 40 includes a first portion 401 and a second portion 402 connected to the first portion 401. The first portion 401 is in contact with the attaching structure 42, located between adjacent sidewalls of adjacent package components 20 and 21, and extended in a vertical direction Z perpendicular to the first surface 30A. The height (such as in the vertical direction Z) of the first portion 401 may be substantially equal to the heights of the package components 20 and 21. The second portion 402 is on top of the first portion 401 and extends laterally to cover a part of the top surface 20A of the package component 20 and a part of the top surface 21A of the package component 21. In accordance with some embodiments, the top surfaces 40A of the dummy dies 40 are higher than the top surfaces 20A, 21A of the package components 20 and 21. Accordingly, the dummy dies 40 being rigid can further provide support to (such as constrain) the package components 20 and 21 in order to reduce or prevent warpage of these package components when the package undergoes drop reliability testing, for example. In accordance with some embodiments, the underfill element 44 extends into gaps between the package components 20, 21 and the dummy dies 40.

One of ordinary skill in the art will appreciate that the embodiments of FIGS. 4A-4C are provided for illustrative purposes, and other suitable cross-sectional shapes of the dummy dies 40 may also be used in different embodiments. Additionally, in some embodiments where additional dummy dies 40' are provided between adjacent package components 21, the dummy dies 40' may also have the same or similar cross-sectional shapes as those of the dummy dies 40 illustrated in FIG. 1D, 4A, 4B, and 4E.

Figure 5A:
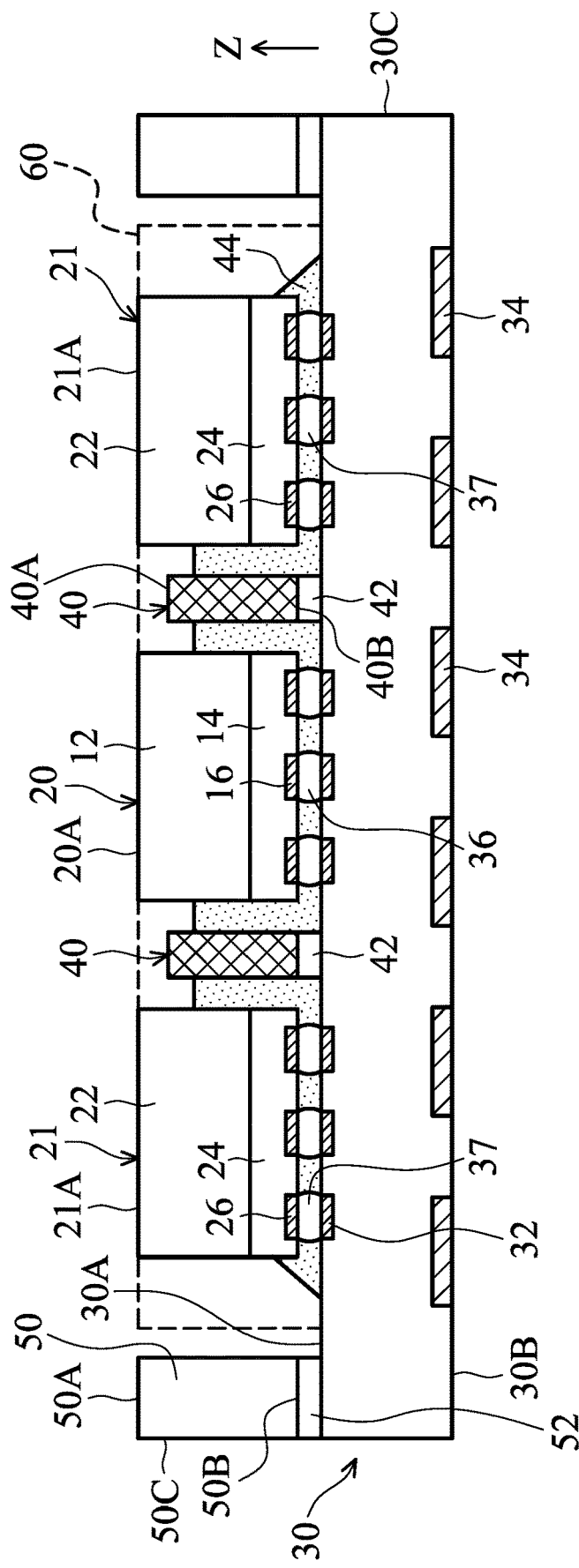
FIGS. 5A and 5B are a cross-sectional view and a plane view of a semiconductor device package in accordance with some embodiments.
Figure 5B:
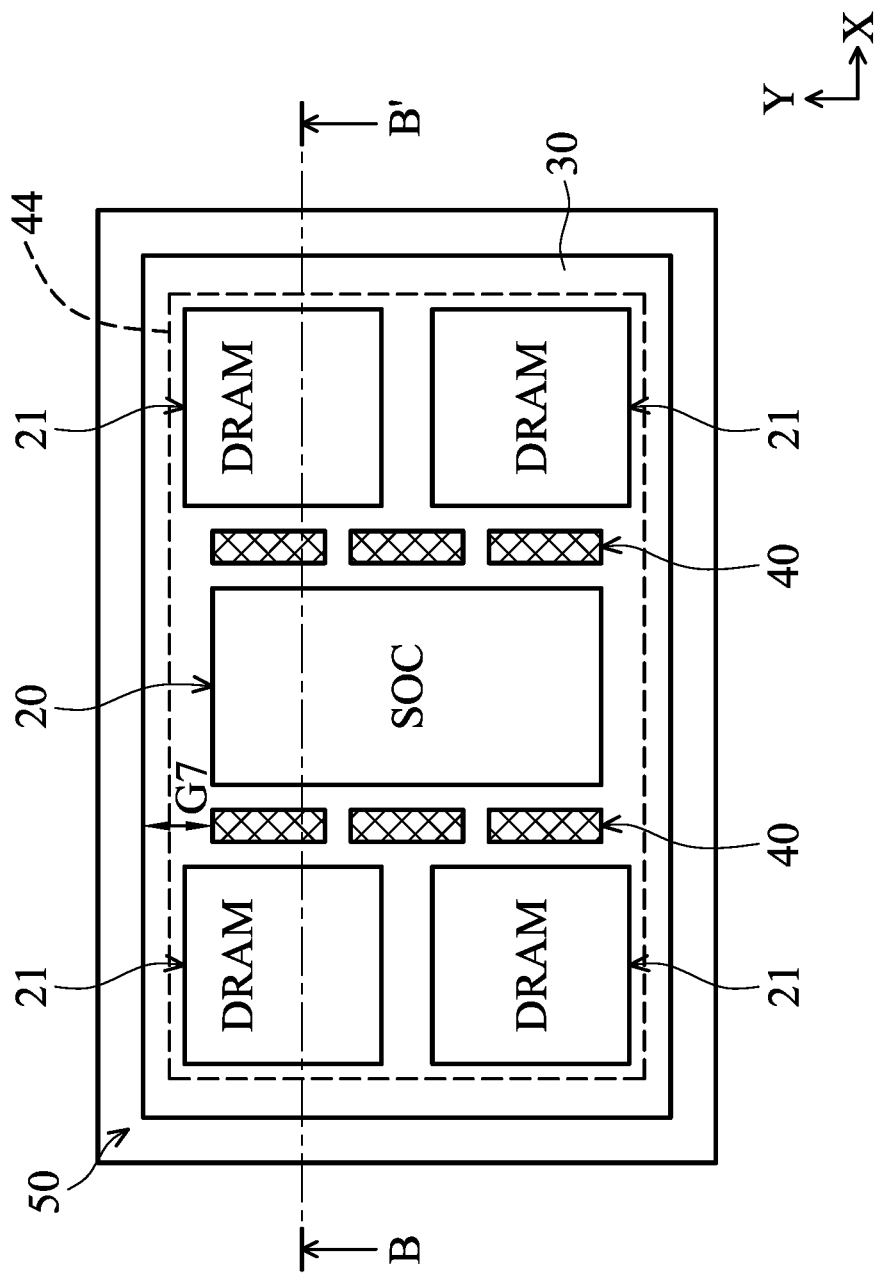

FIGS. 5A and 5B are a cross-sectional view and a plane view of a semiconductor device package in accordance with some embodiments, wherein FIG. 5A is a cross-sectional view taken along a line B-B' in FIG. 5B. The semiconductor device package in FIGS. 5A-5B is similar to the semiconductor device package shown in FIGS. 1D and 2A, except that a ring 50 is further provided on the substrate 30. The ring 50 described herein may also be applied to any of the semiconductor device packages as disclosed in the aforementioned embodiments of FIGS. 1 to 4. The respective process (of attaching ring 50) is illustrated as process 604 in the process flow 600 shown in FIG. 6, which may be after the processes 601 and 602 (i.e., bonding the package components 20 and 21 and attaching the dummy dies 40) and before the process 603 (i.e., disposing the underfill element 44) in some embodiments. The ring 50 may be placed over the substrate 30 using, for example, a pick-and-place tool.

In accordance with some embodiments, the ring 50 is disposed on the first surface 30A of the substrate 30 and surrounds the package components 20, 21, and the dummy dies 40. The ring 50 generally has a rectangular or square ring shape (see FIG. 5B) in top view, depending on the shape of the substrate 30. In some embodiments, the ring 50 is arranged along the periphery of the substrate 30 (for example, an outer edge 50C of the ring 50 is substantially aligned with an edge 30C of the substrate 30). The ring 50 is basically a flat structure with a bottom surface 50B facing the first surface 30A of the substrate 30 and a top surface 50A opposite the bottom surface 50B. The ring 50 is configured as a stiffener ring, and is used to constrain the substrate 30 to alleviate its warpage and/or to enhance robustness of the substrate 30. In accordance with some embodiments, the material of the ring 50 may include metal such as copper, stainless steel, stainless steel/Ni, or the like, but is not limited thereto.

In accordance with some embodiments, the ring 50 is attached to the first surface 30A of the substrate 30 with a second attaching structure 52. Like the dummy dies 40, the ring 50 is also electrically isolated from the substrate 30. In accordance with some embodiments, the second attaching structure 52 is an adhesive that adhere the ring 50 to the substrate 30. The adhesive may be any suitable adhesive, epoxy, die attach film (DAF), or the like. The adhesive may be applied to the bottom surface 50B of the ring 50 or may be applied over the first surface 30A of the substrate 30 in some embodiments.

In some other embodiments, the second attaching structure 52 includes metal pillars with metal cap layers (sometimes referred to as micro bumps) that bond the ring 50 to the substrate 30. The micro bumps may be formed on the bottom surface 50B of the ring 50, the first surfaces 30A of the substrate 30, or both. The micro bumps may be formed at the same time as the micro bumps (e.g. electrical connectors 36 and 37) that bond the package components 20 and 21. The micro bumps (such as the second attaching structure 52) of the ring 50 can be reflowed together with the electrical connectors 36 and 37 of the package components 20 and 21 in some embodiments.

After the ring 50 is attached, an underfill element 44 is dispensed into the gaps between the substrate 30, the package components 20/21, the dummy dies 40, and the ring 50, as the process 603 shown in FIG. 6 described above. In accordance with some embodiments, the gaps between the ring 50 and other adjacent package components (such as the gap G7 between the ring 50 and adjacent dummy dies 40, as shown in FIG. 5B) can be at least greater than about 0.5 mm to facilitate the flowing of the underfill material.

In some other embodiments, an encapsulant 60 is further disposed/molded to encapsulate the package components 20, 21 and the dummy dies 40 therein. The encapsulant 60 can improve the strength and reduce warpage of the overall package structure. The encapsulant 60 may be a molding compound, an epoxy, or the like, and may be applied by compression molding, transfer molding, or the like. The encapsulant 60 and the underlying underfill element 44 may be formed of different materials. A curing process is performed to cure the encapsulant 60, such as a thermal curing, an ultra-violet (UV) curing, or the like. In accordance with some embodiments, the package components 20, 21, and the dummy dies 40 are buried in the encapsulant 60. After the curing of the encapsulant 60, a planarization process such as a Chemical Mechanical Polish (CMP) process or a mechanical grinding process may be performed to remove excess portions of the encapsulant 60 to expose top surfaces of the package components 20 and 21 for heat dissipation.

Embodiments of the disclosure form a semiconductor device package including a substrate, at least a first package component and a second package component over the substrate, and at least one dummy die over the substrate and between the first and second package components. The dummy dies of the disclosure helps to avoid cracks in the substrate by providing support for the stress concentration region (such as between the first and second package components) of the substrate when the package undergoes drop reliability testing, for example. Additionally, the dummy dies of some embodiments can also prevent or reduce warpage of the package by reducing the CTE mismatch between the substrate and the subsequently formed material. Accordingly, the reliability of the semiconductor device package is improved.

In accordance with some embodiments, a semiconductor device package is provided. The semiconductor device package includes a substrate, a first package component, a second package component, and at least one dummy die. The first and second package components are disposed over and bonded to the substrate. The first and second package components are different types of electronic components that provide different functions. The dummy die is disposed over and attached to the substrate. The dummy die is located between the first and second package components and is electrically isolated from the substrate.

In accordance with some embodiments, a semiconductor device package is provided. The semiconductor device package includes a substrate, a first package component, a second package component, and a dummy die. The substrate has a first surface. The first and second package components are bonded to the first surface. The first and second package components are different types of electronic components that provide different functions. The dummy die is attached to the first surface. The dummy die is located in the gap between the first and second package components and is electrically isolated from the substrate. The coefficient of thermal expansion (CTE) of the dummy die is similar to that of the substrate.

In accordance with some embodiments, a method for forming a is provided. The method includes bonding a first package component and a second package component to a substrate. The first and second package components are different types of electronic components that provide different functions. The method further includes attaching at least one dummy die to the substrate. The dummy die is located between the first and second package components and is electrically isolated from the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device package, comprising:
   bonding a first package component and a second package component to a substrate, wherein the first and second package components are different types of electronic components that provide different functions, wherein the first package component is a processor die and the second package component is a memory die;
   attaching at least one dummy die to the substrate, wherein the dummy die is located between the first and second package components and is electrically isolated from the substrate, wherein the first package component and the second package component are disposed on two opposite sides of the dummy die;
   disposing an underfill element between the substrate, the first package component, the second package component, and the dummy die, wherein the dummy die has a greater modulus of elasticity than the underfill element, wherein the dummy die is homogeneous bulk copper or homogeneous bulk stainless steel, and
   wherein the underfill element extends up along all sidewalls of the dummy die and laterally surrounds all the sidewalls of the dummy die in a top view, wherein a top surface of the dummy die is higher than the top surface of the underfill element in a vertical direction such that the top surface and portions of all the sidewalls of the dummy die are exposed from the underfill element, wherein the underfill element has a maximum height lower than the top surface of the dummy die; and
   forming an encapsulant on the substrate to cover the first package component, the second package component, the dummy die, and the underfill element, wherein the top surface and the portions of all the sidewalls of the dummy die exposed from the underfill element are in direct contact with the encapsulant.

2. The method as claimed in claim 1, wherein the underfill element is disposed after the first package component, the second package component, and the dummy die are bonded to or attached to the substrate.

3. The method as claimed in claim 1, wherein the dummy die is substantially free of any functional circuitry.

4. The method as claimed in claim 1, wherein there is a first gap formed between the first and second package components and extending in a first direction, and the dummy die extends in the first direction with a second gap formed between the dummy die and the first package component and a third gap formed between the dummy die and the second package component, wherein the second and third gaps are smaller than the first gap.

5. The method as claimed in claim 4, wherein the at least one dummy die includes a plurality of dummy dies, and the dummy dies are arranged in the first direction.

6. The method as claimed in claim 1, further comprising:
   disposing a plurality of electrical connectors between the first package component and the substrate and between the second package component and the substrate; and
   disposing an attaching structure between the at least one dummy die and the substrate;
   wherein the underfill element is disposed to surround the electrical connectors and the attaching structure.

7. The method as claimed in claim 1, wherein the dummy die is spaced from an edge of the substrate.

8. The method as claimed in claim 1, wherein a height of the dummy die is less than a height of the first package component or the second package component in a direction perpendicular to the first surface, and wherein a distance between a top surface of the encapsulant and the top surface of the dummy die is smaller than a distance between the top surface of the encapsulant and the top surface of the underfill element.

9. A method for forming a semiconductor device package, comprising:
   bonding a first package component and a second package component to a substrate, wherein the first and second package components are different types of electronic components that provide different functions, wherein the first package component is a processor die and the second package component is a memory die;
   attaching at least one dummy die to the substrate, wherein the dummy die is located between the first and second package components and is electrically isolated from the substrate, wherein a coefficient of thermal expansion (CTE) of the dummy die is similar to that of the substrate, wherein the first package component and the second package component are disposed on two opposite sides of the dummy die;
   disposing an underfill element between the substrate, the first package component, the second package component, and the dummy die, wherein the dummy die has a greater modulus of elasticity than the underfill element, wherein the dummy die is homogeneous bulk copper or homogeneous bulk stainless steel, and
   wherein the underfill element extends up along all sidewalls of the dummy die and laterally surrounds all the sidewalls of the dummy die in a top view, wherein a top surface of the dummy die is higher than the top surface of the underfill element in a vertical direction such that the top surface and portions of all the sidewalls of the dummy die are exposed from the underfill element, wherein the top surface of the underfill element and a sidewall of the first package component intersects at a first point, the top surface of the underfill element and a sidewall of the dummy die facing the first package component intersects at a second point, and the first point and the second point are at the same level and lower than the top surface of the dummy die; and forming an encapsulant on the substrate to cover the first package component, the second package component, the dummy die, and the underfill element, wherein the top surface and the portions of all the sidewalls of the dummy die exposed from the underfill element are in direct contact with the encapsulant.

10. The method as claimed in claim 9, wherein the dummy die is substantially free of any functional circuitry.

11. The method as claimed in claim 9, wherein top surfaces of the first and second package components are exposed from the underfill element, and wherein the top surface of the underfill element and a sidewall of the second package component intersects at a third point, the top surface of the underfill element and a sidewall of the dummy die facing the second package component intersects at a fourth point, and the third point and the fourth point are at the same level and lower than the top surface of the dummy die.

12. A method for forming a semiconductor device package, comprising:
bonding a first package component and two second package components to a substrate, wherein a first gap is formed between the first package component and the second package components and extends in a first direction, and a second gap is formed between the second package components and extends in a second direction different from the first direction, wherein the first package component is a processor die and each of the second package components is a memory die;
attaching a plurality of dummy dies to the substrate, wherein the dummy dies are located in the first gap, arranged in the first direction, and separated from the first and second package components, and the dummy dies are electrically isolated from the substrate, wherein the first package component and the second package components are disposed on two opposite sides of the dummy dies, wherein each of the dummy dies has a lengthwise direction extending in the first direction, and one of the dummy dies is arranged to have a middle portion corresponding to the second gap between the two second package components and two end portions between the respective second package component and the first package component;
disposing an underfill element between the substrate, the first package component, the second package components, and the dummy dies, wherein the dummy dies have a greater modulus of elasticity than the underfill element, wherein the dummy dies are homogeneous bulk copper or homogeneous bulk stainless steel, and wherein the underfill element extends up along all sidewalls of the dummy dies and laterally surrounds all the sidewalls of the dummy dies in a top view, wherein top surfaces of the dummy dies are higher than the top surface of the underfill element in a vertical direction such that the top surfaces and portions of all the sidewalls of the dummy dies are exposed from the underfill element; and
forming an encapsulant on the substrate to cover the first package component, the second package components, the dummy dies, and the underfill element, wherein the top surfaces and the portions of all the sidewalls of the dummy dies exposed from the underfill element are in direct contact with the encapsulant.

13. The method as claimed in claim 12, wherein the processor die is a system-on-chip (SOC) die and the memory die is a dynamic random access memory (DRAM) die.

14. The method as claimed in claim 12, further comprising:
disposing a plurality of electrical connectors between the first package component and the substrate and between the second package components and the substrate; and
disposing a plurality of attaching structures between the dummy dies and the substrate;
wherein the underfill element is disposed to surround the electrical connectors and the attaching structures.

15. The method as claimed in claim 12, wherein the dummy dies are substantially free of any functional circuitry.

16. The method as claimed in claim 12, wherein a width of a third gap between the dummy dies and the first package component is greater than 0.5 mm, and a width of a fourth gap between the dummy dies and the second package components is greater than 0.5 mm.

17. The method as claimed in claim 12, wherein a gap between adjacent dummy dies of the plurality of dummy dies is greater than 0.5 mm.

18. The method as claimed in claim 17, wherein a combined length of the plurality of dummy dies in the first gap is equal to a length of the first package component in the extending direction.

19. The method as claimed in claim 12, further comprising a second dummy die disposed in the second gap, wherein the second dummy die extends in the second direction.

20. The method as claimed in claim 19, wherein a gap between the second dummy die and each of the second package components is greater than 0.5 mm.

* * * * *